United States Patent
Lin et al.

[11] Patent Number: 6,046,083
[45] Date of Patent: Apr. 4, 2000

[54] GROWTH ENHANCEMENT OF HEMISPHERICAL GRAIN SILICON ON A DOPED POLYSILICON STORAGE NODE CAPACITOR STRUCTURE, FOR DYNAMIC RANDOM ACCESS MEMORY APPLICATIONS

[75] Inventors: Dahcheng Lin, Hsinchu; Jung-Ho Chang, Uen-Lin; Hsi-Chuan Chen, Tainan; Kuo-Shu Tseng, Hsinchu, all of Taiwan

[73] Assignee: Vanguard International Semiconductor Corporation, Hsin-Chu, Taiwan

[21] Appl. No.: 09/105,185

[22] Filed: Jun. 26, 1998

[51] Int. Cl.[7] .................... H01L 21/20; H01L 21/8242
[52] U.S. Cl. ............... 438/255; 438/398; 438/DIG. 964
[58] Field of Search ................... 438/398, 255, 438/658, 593, 665, 684, DIG. 964; 117/103; 257/300, 64

[56] References Cited

U.S. PATENT DOCUMENTS

| | | | |
|---|---|---|---|
| 5,266,514 | 11/1993 | Tuan et al. | 438/398 |
| 5,597,754 | 1/1997 | Lou et al. | 438/398 |
| 5,634,974 | 6/1997 | Weimer et al. | 117/103 |
| 5,639,685 | 6/1997 | Zahurak et al. | 438/658 |
| 5,639,689 | 6/1997 | Woo | 438/398 |
| 5,656,531 | 8/1997 | Thakur et al. | 438/398 |
| 5,691,228 | 11/1997 | Ping et al. | 438/255 |
| 5,760,434 | 6/1998 | Zahurak et al. | 257/309 |
| 5,831,282 | 11/1998 | Nuttall | 257/64 |
| 5,837,580 | 11/1998 | Thakur et al. | 438/255 |
| 5,858,852 | 1/1999 | Aiso et al. | 438/396 |
| 5,963,805 | 10/1999 | Kang et al. | 438/255 |

*Primary Examiner*—Charles Bowers
*Assistant Examiner*—Evan Pert
*Attorney, Agent, or Firm*—George O. Saile; Stephen B. Ackerman

[57] ABSTRACT

A process for creating a storage node electrode for a DRAM capacitor structure, featuring increased surface area accomplished using an HSG silicon layer as the top layer for the storage node electrode, has been developed. The process features the use of a composite buffer layer of undoped and lightly doped amorphous silicon layers, located overlying a heavily doped amorphous silicon layer, and then followed by the deposition of HSG silicon seeds. A first anneal cycle then allows formation of an undoped HSG silicon layer to be realized on the underlying heavily doped amorphous silicon layer, via consumption of the HSG seeds, and of the composite buffer layer of undoped and lightly doped amorphous silicon layers. A second anneal cycle then allows dopant from the underlying heavily doped amorphous silicon layer to reach the undoped HSG silicon layer, resulting in a doped HSG silicon layer. Patterning, or CMP, of the doped HSG silicon layer, and of the heavily doped amorphous silicon layer, results in the creation of a storage node electrode. The use of the composite buffer layer allows the growth of an undoped HSG silicon layer to be achieved, thus maximizing uniformity and HSG silicon roughness, while the anneal cycle, applied to the undoped HSG silicon layer, results in the attainment of the doped HSG silicon layer, offering reduced capacitance depletion compared to undoped HSG silicon counterparts.

11 Claims, 5 Drawing Sheets

GROWTH ENHANCEMENT OF HEMISPHERICAL GRAIN SILICON ON A DOPED POLYSILICON STORAGE NODE CAPACITOR STRUCTURE, FOR DYNAMIC RANDOM ACCESS MEMORY APPLICATIONS

BACKGROUND OF THE INVENTION (1) Field of the Invention

The present invention relates to a method used to create a capacitor structure for a dynamic random access memory, (DRAM) device.

(2) Description of the Prior Art

The semiconductor industry is continually striving to improve semiconductor device performance, while still attempting to reduce the manufacturing costs of these semiconductor devices. These objectives have been in part realized by the ability of the semiconductor industry to fabricate semiconductor memory chips using sub-micron features. The use of sub-micron features, or micro-miniaturization, results in a reduction of performance degrading capacitances and resistances. In addition, the use of smaller features results in a smaller chip, however still possessing the same level of integration obtained for larger semiconductor chips fabricated with larger features. This allows a greater number of the denser, smaller chips to be obtained from a specific size starting substrate, thus resulting in a lower manufacturing cost for an individual chip.

The use of smaller, or sub-micron, features, when used for the fabrication of dynamic random access memory (DRAM) devices, in which the capacitor of the DRAM device is a crown or stacked capacitor (STC) structure, presents difficulties when attempting to increase STC capacitance. A DRAM cell is usually comprised of the crown/STC structure overlying a transfer gate transistor, and connected to the source of the transfer gate transistor. However, the decreasing size of the transfer gate transistor limits the dimensions of the crown/STC structure. To increase the capacitance of the crown/STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the crown/STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area available for placement of overlying crown/STC structures.

One method of maintaining, or increasing crown/STC capacitance, while still decreasing the lateral dimension of the capacitor, has been the use of rough, or hemispherical grain (HSG) silicon layers. The use of HSG silicon, comprised of convex and concave features, results in an increase in surface area when compared to counterparts fabricated with smooth, polysilicon surfaces. One factor influencing HSG silicon growth is the dopant concentration of the underlying amorphous silicon or polysilicon layer, from which the HSG silicon layer is formed from. To enhance DRAM performance, the capacitance depletion characteristics of the storage node structure has to be minimized, accomplished via the use of a heavily doped storage node structure. However, to obtain maximum HSG silicon roughness, the doping level of the underlying material, from which the HSG silicon layer is formed on, has to be maintained at a low level. Therefore to optimize these parameters, capacitance depletion and HSG silicon roughness, a novel method, incorporating a combination of doped and undoped silicon layers, is used as a buffer layer, in the formation of the HSG silicon layer, and is described in this invention. Prior art, such as Ping et al, in U.S. Pat. No. 5,691,228, describe a method for growing HSG silicon layers, however that method does not include the novel combination of silicon layers, and seeding/anneal steps, used in this present invention, allowing HSG silicon layers to be formed from underlying undoped layers, while maintaining a high dopant level for the storage node structure.

SUMMARY OF THE INVENTION

It is an object of this invention to increase the surface area of a storage node electrode, for a DRAM capacitor structure, via the use of an HSG silicon layer, residing on the top surface of the storage node shape.

It is another object of this invention to form an HSG silicon layer by initially forming HSG silicon seeds, on an underlying composite layer, comprised of undoped, and lightly doped, amorphous silicon layers, wherein the composite layer resides on a heavily doped, amorphous silicon, storage node shape.

It is still another object of this invention to form the HSG silicon layer from the HSG silicon seeds, and from consumption of the underlying composite layer, comprised of a combination of undoped and lightly doped silicon layers, via a first anneal procedure.

It is still yet another object of this invention to perform a second anneal procedure, to allow dopant from the underlying, heavily doped storage node shape, to diffuse into the undoped HSG silicon layer.

In accordance with the present invention a method for forming an HSG silicon layer, on the top surface of a storage node shape, has been developed, featuring a process which allows an HSG silicon layer to be formed from underlying, lightly doped silicon layers, followed by an anneal procedure, resulting in the attainment of the desired doping level for the HSG layer, accomplished via diffusion from an underlying, heavily doped storage node shape. A transfer gate transistor comprised of: a thin gate insulator; an insulator capped, polysilicon gate structure, a lightly doped source/drain region; insulator spacers on the sides of the polysilicon gate structure; and a heavily doped source/drain region; is formed on a semiconductor substrate. A first insulator layer is next deposited and planarized, followed by the opening of a storage node contact hole in the first insulator layer, made to expose the source region of the transfer gate transistor. A lightly doped polysilicon layer is next deposited, completely filling the storage node contact hole, followed by etching of the polysilicon layer, removing polysilicon from the top surface of the first insulator layer creating a polysilicon contact plug, in the storage node contact hole. A second insulator layer is next deposited, followed by patterning and etching to form an opening in the second insulator layer, exposing the polysilicon contact plug. After formation of this opening, a heavily doped amorphous silicon layer is deposited, overlying the polysilicon contact plug, followed by the in situ deposition of a composite, amorphous silicon layer, comprised of: a first, undoped amorphous silicon layer; a lightly doped amorphous silicon layer; and a second undoped amorphous silicon layer. HSG silicon seeds are next formed on the top surface of the composite amorphous layer, followed by a first anneal procedure, used to form an HSG silicon layer, overlying the heavily doped amorphous silicon layer, via consumption of the HSG silicon seeds, and consumption of the composite amorphous silicon layer. A second anneal procedure is then employed to allow the undoped HSG silicon layer to receive dopant, via diffusion from the underlying, heavily doped amorphous silicon layer. Patterning/etching, or chemical mechanical polishing (CMP) is next performed to isolate individual cell capacitor structures (bottom electrodes). A capacitor dielectric layer on the top surface of the doped HSG silicon layer is formed, followed by deposition of a heavily doped polysilicon layer. A patterning/etching procedure is then applied to the heavily doped polysilicon layer, as well as to the capacitor dielectric layer, to create the storage node electrode for the DRAM capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a storage node electrode, comprised of an HSG silicon layer located on the top surface of a storage node shape, and used to increase the surface area as well as capacitance of a DRAM capacitor, will now be described in detail. The transfer gate transistor used for the DRAM device in this invention will be an N channel device. However the storage node electrode, featuring the HSG silicon layer, described in this invention can also be applied to a P channel transfer gate transistor. In addition, the heavily doped lightly doped, and undoped amorphous silicon layers described in this invention can be replaced by heavily doped, lightly doped, and undoped polysilicon layer counterparts, if desired.

Figure 1:
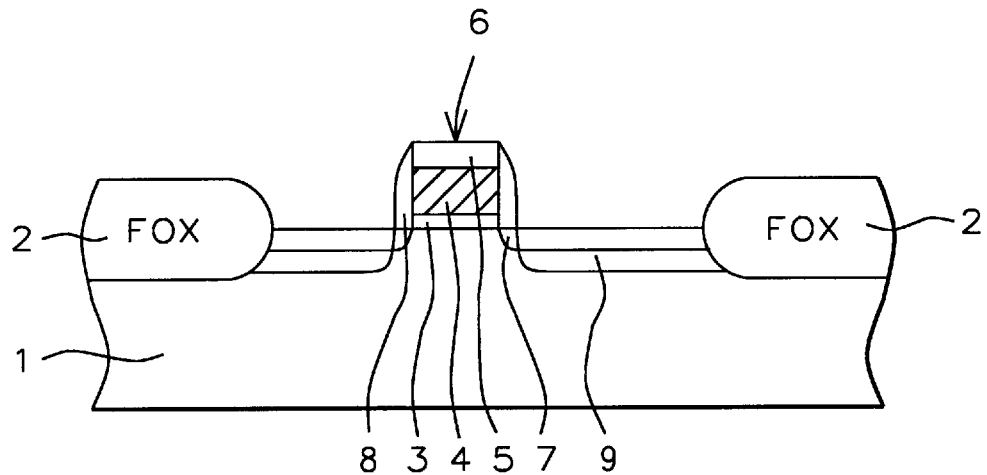
FIGS. 1 through 10, which schematically, in cross-sectional style, show the key fabrication stages used to create a capacitor structure for a DRAM device, in which the top surface of a storage node electrode is formed to have a roughened, doped HSG silicon layer.

Referring to FIG. 1, a P type semiconductor substrate 1 with a <100> single crystalline orientation is used. Field oxide (FOX) regions 2, used for isolation purposes, are formed via thermal oxidation procedures, using a patterned oxidation resistant mask, such as a silicon nitride—silicon oxide composite insulator layer, to protect subsequent device regions from the oxidation procedure. After formation of FOX regions 2, at a thickness between about 2000 to 5000 Angstroms, the composite insulator layer is removed, using hot phosphoric acid for silicon nitride, while a buffered hydrofluoric acid solution is used for the underlying silicon oxide layer. After a series of wet cleans, a gate insulator layer 3 of silicon oxide is thermally grown in an oxygen-steam ambient at a temperature between about 750 to 1050° C., to a thickness between about 40 to 200 Angstroms. A polysilicon layer 4, is next deposited using low pressure chemical vapor deposition (LPCVD) procedures, at a temperature between about 500 to 700° C., and to a thickness between about 500 to 4000 Angstroms. The polysilicon can either be grown intrinsically and doped via ion implantation of arsenic or phosphorous at an energy between about 10 to 80 KeV and using a dose between about 1E13 to 1E16 atoms/cm$^2$, or the polysilicon layer can be grown using in situ doping procedures, via the incorporation of either arsine or phosphine to the silane or disilane ambient. Polysilicon layer 4 can be replaced by a polycide layer if increased conductivity of the gate structure or word line is desired. The polycide layer is comprised of an overlying metal silicide layer, such as tungsten silicide or titanium silicide, deposited using LPCVD procedures, and an underlying polysilicon layer, again deposited via LPCVD procedures. A first insulator layer 5 comprised of silicon oxide, used as a cap insulator layer, is next grown via the use of either LPCVD or plasma enhanced chemical vapor deposition (PECVD) procedures to a thickness between about 600 to 2000 Angstroms. First insulator layer 5, can also be a silicon nitride layer, again deposited using LPCVD or PECVD procedures, to a thickness between about 600 to 2000 Angstroms. Conventional photolithographic and reactive ion etching (RIE) procedures, using $CHF_3$ as an etchant for first insulator layer 5, and using $Cl_2$ as an etchant for polysilicon, or polycide layer 4, are used to create the polysilicon gate structure 6, comprised of polysilicon or polycide layer 4, with overlying capping, first insulator layer 5, shown schematically in FIG. 1. Photoresist removal is accomplished via plasma oxygen ashing and careful wet cleans.

A lightly doped source/drain region 7, is next formed via ion implantation of phosphorous, at an energy between about 5 to 60 KeV, and at a dose between about 1E13 to 1E15 atoms/cm$^2$. A second insulator layer, comprised of silicon oxide, is then deposited using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 8 on the sides of polysilicon or polycide gate structure 6. Insulator spacers 8 can also be comprised of silicon nitride. A heavily doped source/drain region 9, is then formed via ion implantation of arsenic, at an energy between about 30 to 100 KeV, at a dose between about 1E14 to 5E16 atoms/cm$^2$. The result of these steps are also shown schematically in FIG. 1.

Figure 2:
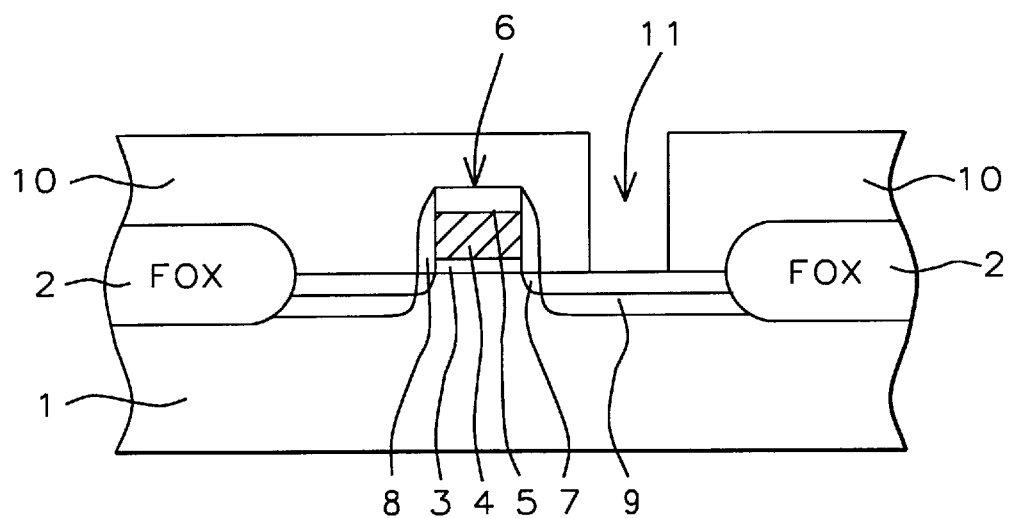

A third insulator layer 10, comprised of either silicon oxide, boro-phosphosilicate glass (BPSG), or phosphosilicate glass (PSG), is next deposited using LPCVD or PECVD procedures at a temperature between about 600 to 800° C. to a thickness between about 1000 to 6000 Angstroms. Third insulator layer 10 is grown using tetraethylorthosilicate (TEOS) as a source with the addition of either diborane and phosphine for the BPSG layer, or the addition of only phosphine for the PSG layer. Third insulator layer 10 is then planarized using chemical mechanical polishing, to provide a smoother surface for subsequent depositions and patterning procedures. Conventional photolithographic and RIE procedures, using $CHF_3$ as an etchant, are used to open storage node contact hole 11 in third insulator layer 10, exposing the top surface of heavily doped source/drain region 9. Photoresist removal is performed via use of plasma oxygen ashing and careful wet cleans. The result of these procedures are schematically shown in FIG. 2.

Figure 3:
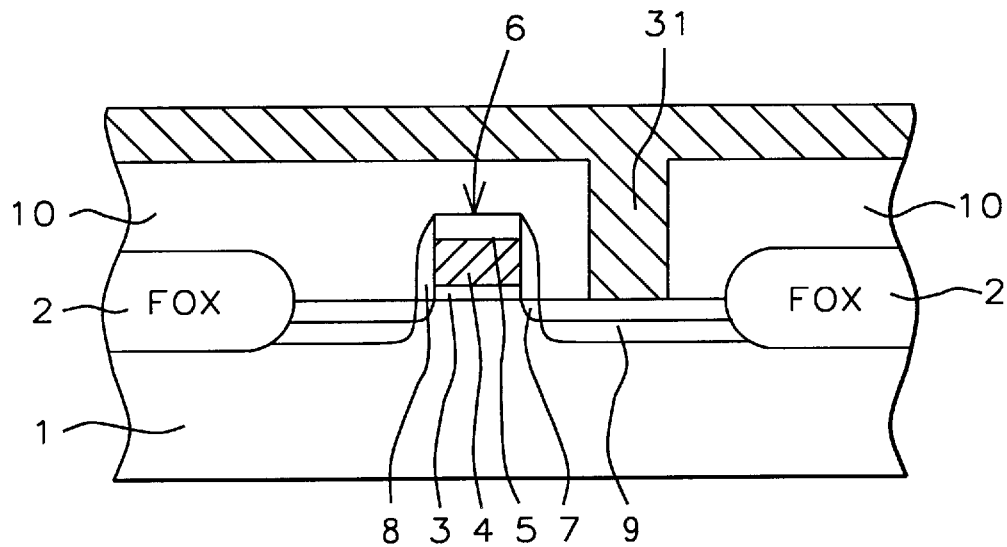
Figure 4:
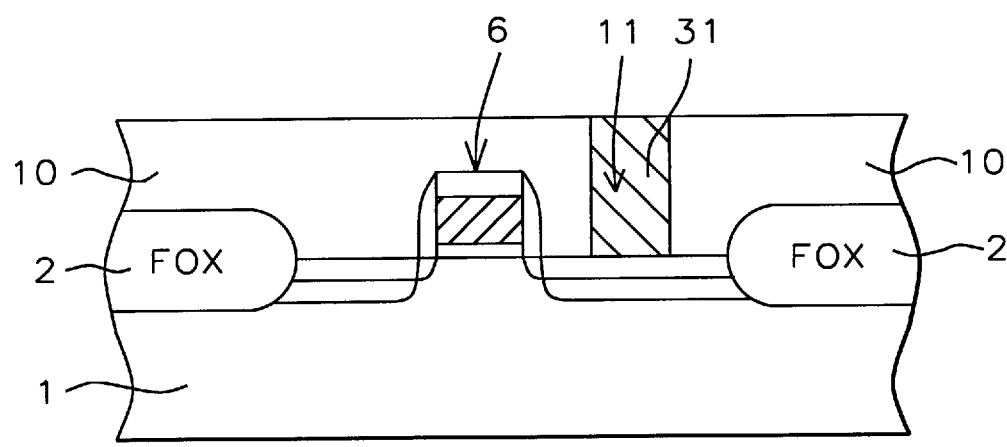
Figure 5:
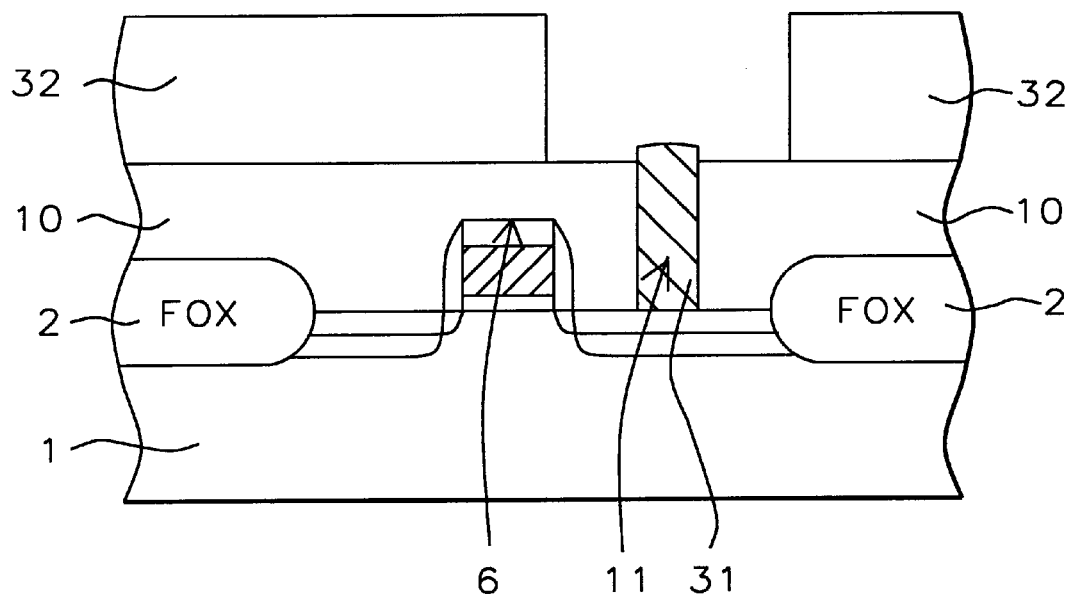

Referring to FIG. 3, an amorphous silicon, or a polysilicon silicon layer 31, is deposited, via LPCVD procedures at a temperature between about 500 to 700° C., to a thickness between about 1000 to 10000 Angstroms, completely filling storage node contact hole 11. The amorphous silicon, or polysilicon layer 31, is deposited using an in situ doping procedure, via the addition of phosphine to a silane or disilane ambient, resulting in a bulk concentration between about 1E19 to 2E20 atoms/cm$^3$. Removal of polysilicon layer 31 from the top surface of insulator layer 10 is accomplished via an anisotropic RIE procedure using $Cl_2$ as an etchant, creating polysilicon contact plug 31 in storage node opening 11 as shown schematically in FIG. 4. Next a fourth insulator layer 32, comprised of either silicon oxide, phosphosilicate glass (PSG), or boro-phosphosilicate glass (BPSG), is deposited using PECVD or LPCVD procedures to a thickness between about 5000 to 15000 Angstroms. Conventional photolithographic and anisotropic RIE procedures using $CHF_3$ as an etchant are used to create opening 33 in fourth insulator layer 32, exposing the top surface of polysilicon contact plug 31. This is schematically shown in FIG. 5. The photoresist shape, used as a mask for defining opening 33, is removed via plasma oxygen ashing and careful wet cleans.

Figure 6:
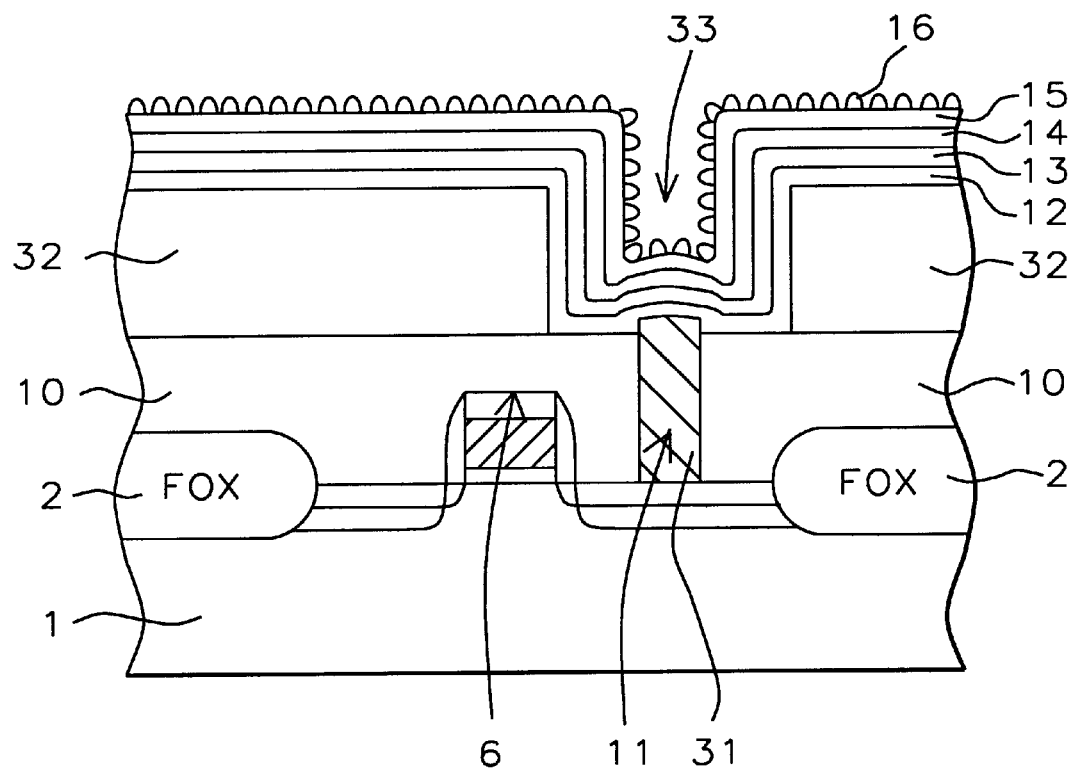

An amorphous silicon layer 12, shown schematically in FIG. 6, is next deposited using LPCVD procedures, at a temperature below 550° C., and is doped in situ during deposition via the addition of phosphine to a silane or disilane ambient, resulting in a bulk concentration of 4E20 atoms/cm$^2$, or higher, to its saturation level. The heavy dopant level used for amorphous silicon layer 12 allows a minimum of capacitance depletion, thus not adversely influencing DRAM device performance, which would occur with counterparts fabricated using less heavily doped amorphous silicon layers. The ability to form effective HSG silicon layers is influenced by the doping levels of underlying layers used in the HSG silicon formation procedure. If the doping levels of the underlying silicon layer is high, poor uniformity, as well as decreased growth, of HSG silicon will occur. Therefore, to obtain an optimum HSG silicon layer comprised of convex and concave features, and while still maintaining a heavily doped storage node shape, a composite layer comprised of undoped and lightly doped amorphous silicon layers is used as a buffer layer between the overlying HSG silicon layer and the heavily doped underlying amorphous silicon layer. FIG. 6, schematically illustrates the formation of the composite layer used as the buffer layer. A first, undoped amorphous silicon layer 13 is deposited, using LPCVD procedures, at a temperature below 550° C., to a thickness less than 200 Angstroms, using $SiH_4$ or $Si_2H_6$ as a source. Next a lightly doped amorphous silicon layer 14 is deposited, in situ, in the same LPCVD furnace used for amorphous silicon layer 13, at a temperature below 550° C. Amorphous silicon layer 14, is deposited to a thickness less than 400 Angstroms, and is in situ doped, during deposition, via the addition of phosphine, to a $SiH_4$ or a $Si_2H_6$ ambient, resulting in a bulk concentration between about 1E19 to 4E20 atoms/cm$^3$. Finally a second undoped amorphous silicon layer 15 is deposited to a thickness less than 200 Angstroms, in situ, again at a temperature below 550° C., in the same LPCVD furnace used for the previous amorphous silicon layers.

Figure 7:
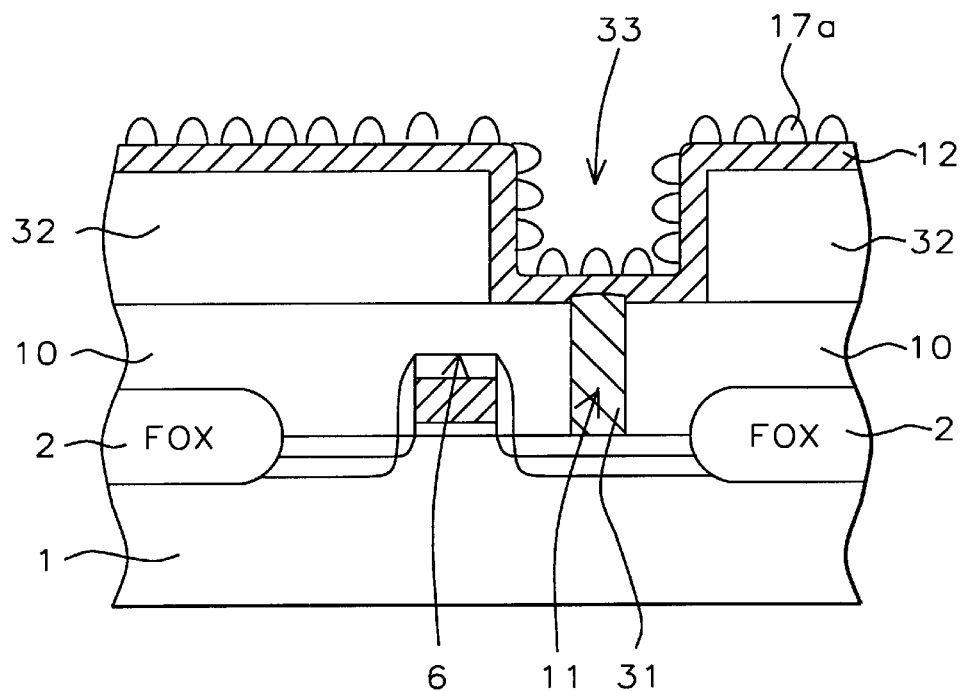

The deposition of HSG silicon seeds 16 is next addressed, shown schematically in FIG. 6. Via use of the same LPCVD furnace, HSG silicon seeds 16 are in situ formed on the top surface of the second undoped amorphous silicon layer 15, at a temperature between about 550 to 580° C., and at a pressure below 1.0 torr, using a silane or a disilane flow, with a concentration less than 1.0E-3 mole/m$^3$, in nitrogen carrier gas, for a time between about 5 to 120 min. A critical first anneal is next performed, in situ, in the same LPCVD tool used for HSG silicon seed deposition, at a temperature between about 550 to 580° C., again at a pressure between less than 1.0 torr, and for a time between about 0 to 120 min, in a nitrogen carrier gas, resulting in the formation of HSG silicon layer 17a on heavily doped amorphous silicon layer 12. This is schematically shown in FIG. 7. HSG silicon layer 17a is formed during the first anneal cycle from undoped HSG silicon seeds 16, from the second undoped amorphous silicon layer 15, from the lightly doped amorphous silicon layer 14, and from a portion of the first undoped amorphous silicon layer 13. Since these layers were either intrinsic or lightly doped, the convex and concave features of HSG silicon layer 17a were formed, effectively, without uniformity problems, which would have not been the case if the dopant from these layers, or from underlying heavily doped amorphous silicon layer 12, had been present during the formation of HSG silicon layer 17a.

Figure 8:
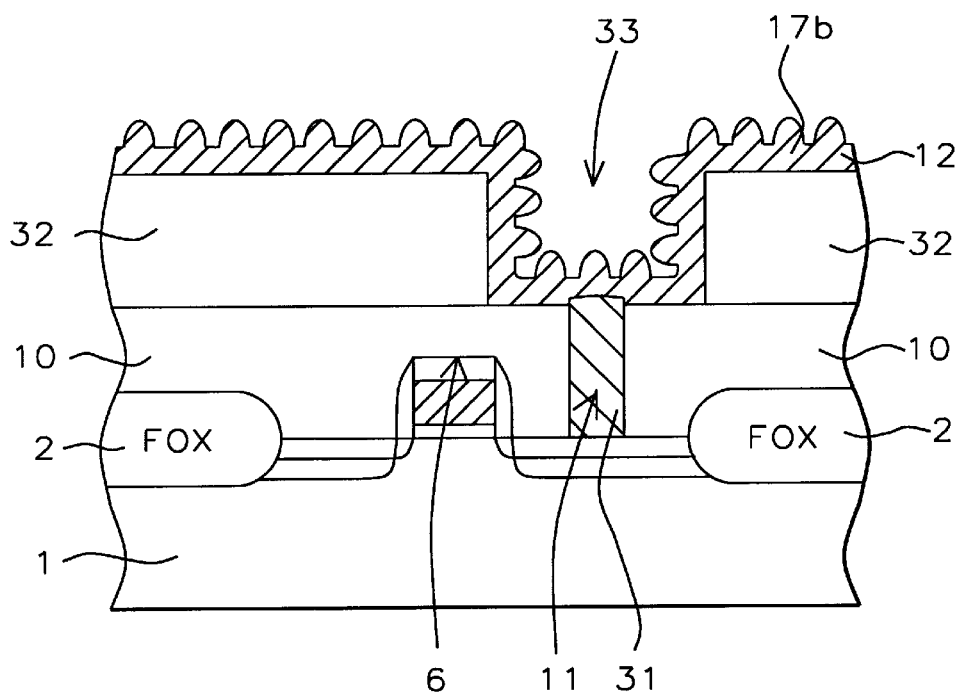
Figure 9:
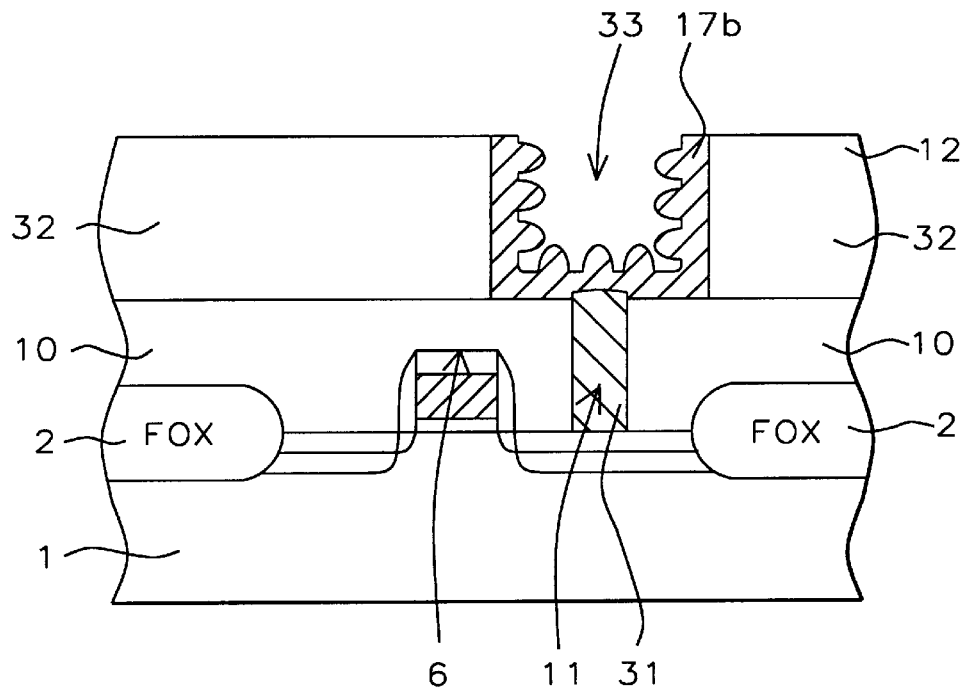

A second anneal cycle is now performed at a temperature between about 800 to 850° C., for a time between about 20 to 60 min, allowing the undoped HSG silicon layer 17a to become doped from the underlying heavily doped amorphous silicon layer 12, resulting in doped HSG silicon layer 17b, schematically shown in FIG. 8. The conversion of HSG silicon layer 17a to doped HSG silicon layer 17b, performed at this stage of the process, is used to crystallize all the amorphous silicon and HSG layers. Therefore, further HSG growth can be ignored at this stage due to the silicon crystallization. Also, at the same time, dopant diffusion from heavily doped layer 12, to the HSG silicon layer occurs, so that the capacitance depletion can be reduced. After the second annealing procedure is performed, the inside crown cave, or opening 33, is filled with photoresist to protect HSG silicon layer 17b from a subsequent CMP procedure used to remove HSG silicon layer 17b from the top surface of fourth insulator layer 32. Photoresist is then removed via plasma oxygen ashing and careful wet cleans. The result of these procedures is schematically shown in FIG. 9. If desired, conventional photolithographic and anisotropic RIE procedures can also be employed to pattern HSG silicon layer 17b, resulting in the structure shown in FIG. 9.

Figure 10:
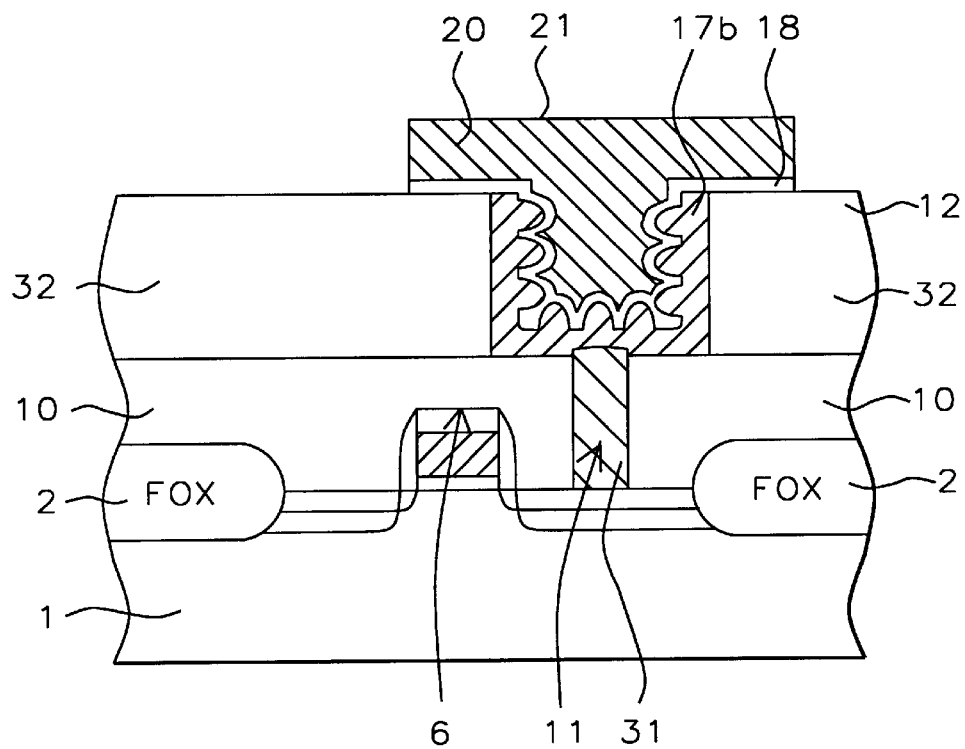

The completion of the storage node electrode and the DRAM capacitor structure is next addressed, and is shown schematically in FIG. 10. A capacitor dielectric layer 18, exhibiting a high dielectric constant, such as ONO (Oxidized—silicon Nitride—silicon Oxide), is next formed. The ONO layer is formed by initially growing a silicon dioxide layer, on doped HSG silicon layer 17b, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. This is schematically shown in FIG. 10. A polysilicon layer is next deposited, via LPCVD procedures, at a temperature between about 500 to 700° C., to a thickness between about 1000 to 2000 Angstroms. The polysilicon layer is in situ doped, during deposition, via the addition of arsine or phosphine to a silane or disilane ambient. Photolithographic and RIE procedures using $Cl_2$ as an etchant for polysilicon, and using $CHF_3$ as an etchant for the capacitor dielectric layer, are employed to pattern the polysilicon and dielectric layers, creating polysilicon upper electrode structure 20 on capacitor dielectric layer 18, completing the procedure used to create DRAM capacitor structure 21, schematically shown in FIG. 10. The photoresist shape, used as a mask for patterning of polysilicon structure 20, and capacitor dielectric layer 18, is once again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a storage node electrode, for a DRAM capacitor structure, featuring a doped hemispherical grain silicon (HSG) layer, used as the top layer of a storage node shape, and with said doped HSG silicon layer formed during an anneal cycle, from consumption of HSG silicon seeds, and from consumption of undoped, and lightly doped, amorphous silicon layers, comprising the steps of:

providing a transfer gate transistor on a semiconductor substrate, comprised of a polysilicon gate structure, on an underlying gate insulator layer, and a source/drain region in said semiconductor substrate;

depositing a first insulator layer on said transfer gate transistor;

planarizing said first insulator layer;

opening a storage node contact hole in said first insulator layer, exposing the top surface of a source region in said transfer gate transistor;

depositing a doped amorphous silicon layer on said first insulator layer, and completely filling said storage node contact hole;

forming a silicon plug, in said storage node contact hole, via removal of said doped amorphous silicon layer from the top surface of said first insulator layer;

depositing a second insulator layer;

forming an opening in said second insulator layer, exposing the top surface of said silicon plug;

depositing a heavily doped amorphous silicon layer;

depositing a first undoped amorphous silicon layer, on said heavily doped amorphous silicon layer;

depositing a lightly doped amorphous silicon layer, on said first undoped amorphous silicon layer;

depositing a second undoped amorphous silicon layer, on said lightly doped amorphous silicon layer;

forming hemispherical grain (HSG) silicon seeds, on the top surface of said second undoped amorphous silicon layer;

performing a first anneal cycle to create an HSG silicon layer, on said heavily doped amorphous silicon layer, with said undoped HSG silicon layer being formed from consumption of said HSG silicon seeds, from consumption of said second undoped amorphous silicon layer, from consumption of said lightly doped amorphous silicon layer, and from consumption of said first undoped amorphous silicon layer;

performing a second anneal cycle to convert said undoped HSG silicon layer, to said doped HSG silicon layer;

removing said doped HSG silicon layer from the top surface of said second insulator layer, via a chemical mechanical polishing procedure, creating a bottom electrode structure;

forming a capacitor dielectric layer on said doped HSG silicon layer;

depositing a doped polysilicon layer;

patterning of said doped polysilicon layer, and of said capacitor dielectric layer to form a polysilicon upper electrode shape, for said DRAM capacitor structure.

2. The method of claim 1, wherein said heavily doped amorphous silicon layer is obtained via LPCVD procedures, at a temperature below 550° C., and is in situ doped, during deposition, via the addition of phosphine, to a silane ambient, resulting in a bulk concentration, for said heavily doped amorphous silicon layer, of 4E20 atoms/cm$^3$, or greater to its saturation level.

3. The method of claim 1, wherein said first undoped amorphous silicon layer is obtained via LPCVD procedures, at a temperature below 550° C., to a thickness less than 200 Angstroms, using silane, or disilane, as a source.

4. The method of claim 1, wherein said lightly doped amorphous silicon layer is obtained via LPCVD procedures, at a temperature below 550° C., to a thickness less than 400 Angstroms, and is in situ doped, during deposition, via the addition of phosphine to a silane, or to a disilane flow, resulting in a bulk concentration, for said lightly doped amorphous silicon layer, between about 1E19 to 4E20 atom/cm$^3$.

5. The method of claim 1, wherein said second undoped amorphous silicon layer is deposited via LPCVD procedures, at a temperature below 550° C., to a thickness less than 200 Angstroms, using silane, or disilane, as a source.

6. The method of claim 1, wherein said HSG silicon seeds are formed using LPCVD procedures, at a temperature between about 550 to 580° C., at a pressure less than 1.0 torr, for a time between about 5 to 120 min., and using silane, or disilane, as a source, at a flow concentration less than 1.0E-3 moles/m$^3$, in a nitrogen ambient.

7. The method of claim 1, wherein said first anneal cycle, used to form said undoped HSG silicon layer, is performed at a temperature between about 550 to 580° C., at a pressure below 1.0 torr, for a time between about 0 to 120 min.

8. The method of claim 1, wherein said second anneal cycle, used to convert said undoped HSG silicon layer to said doped HSG silicon layer, is performed at a temperature between about 800 to 850° C., for a time between about 20 to 60 min, in a nitrogen ambient.

9. The method of claim 1, wherein said capacitor dielectric layer is ONO, with an equivalent silicon dioxide thickness between about 40 to 80 Angstroms, created by growing a thin silicon oxide layer on said doped HSG silicon layer, at a thickness between about 10 to 50 Angstroms, depositing between about 10 to 60 Angstroms of a silicon nitride layer, and oxidizing said silicon nitride layer to from a silicon oxynitride layer on said thin silicon oxide layer.

10. The method of claim 1, wherein said doped polysilicon layer is deposited using LPCVD procedures, at a temperature between about 500 to 700° C., to a thickness between about 1000 to 2000 Angstroms.

11. The method of claim 1, wherein said polysilicon upper electrode is created using an anisotropic RIE procedure, applied to said polysilicon layer, using $Cl_2$ as an etchant.

* * * * *